United States Patent

Hong et al.

[11] Patent Number: 6,159,803
[45] Date of Patent: Dec. 12, 2000

[54] METHOD OF FABRICATING FLASH MEMORY

[75] Inventors: Gary Hong; Joe Ko, both of Hsinchu, Taiwan

[73] Assignee: United Microelectronics Corp., Hsinchu, Taiwan

[21] Appl. No.: 09/186,404

[22] Filed: Nov. 4, 1998

[30] Foreign Application Priority Data

Dec. 12, 1997 [TW] Taiwan ................................. 86118768

[51] Int. Cl.[7] .............................................. H01L 21/8247
[52] U.S. Cl. ............................................ 438/264; 438/546
[58] Field of Search .................................... 438/257, 263, 438/264, 266, 286, 529, 545, 546

[56] References Cited

U.S. PATENT DOCUMENTS

| | | | |
|---|---|---|---|
| 4,814,286 | 3/1989 | Tam | 438/266 |
| 5,747,370 | 5/1998 | Lee | 438/546 |
| 5,776,811 | 7/1998 | Wang et al. | 438/264 |
| 5,854,108 | 12/1998 | Hsu et al. | 438/264 |

*Primary Examiner*—Chandra Chaudhari
*Attorney, Agent, or Firm*—Hickman Coleman & Hughes, LLP

[57] ABSTRACT

A method of fabicrating a flash memory. A semiconductor substrate having a field oxide layer which comprises a plurality of parallel oxide lines, a plurality of parallel word lines perpendicular to the parallel oxide lines, a dielectric layer having a same structure as and under the word lines, a plurality of floating gates separated by the field oxide layer from each other under the dielectric layer, and a plurality of regions encompassed by the field oxide laver and the word lines is provided. A first step of ion implantation to the substrate is performed by using the word lines as masks, so that a plurality of source regions and a plurality of drain regions are formed beside the word lines. Whereas each of the source regions and each of the drain regions are formed in the regions encompassed by the field oxide layer and the word lines. A photo-resist layer is formed to cover the drain regions. A second step of ion implantation to the substrate is performed by using the photo-resist layer and the parallel word lines as masks. The photo-resist layer is removed.

12 Claims, 5 Drawing Sheets

METHOD OF FABRICATING FLASH MEMORY

BACKGROUND OF THE INVENTION

1. Field of the Invention

The invention relates to a method of fabricating a flash memory. and more particularly to a method of fabricating a flash memory with a self-aligned source.

2. Description of the Related Art

Non-volatile memories are applied to a variety of electronic devices for the functions of storing structure data, programming data, or data which can be accessed iteratively. In the application of non-volatile memories, the electrically erasable and programmable characteristics of the electrically erasable read only memory (EEPROM), especially the flash memory, are further emphatic. For EEPROMs, a more flexible application in transforming data is obtained by a flash memory during the fabricating process, or in an electronic device product. In the U.S. Pat. No. 5,416,349, a typical example of a flash memory is disclosed by Bergemont. The flash memory comprises a sharing source and buried bit line. The structure of sharing a source and a bit line has a high density, and therefore, reduce the cost of production. The field of flash memory is very wide that it is very sensitive for the cost. Thus, for fabricating a flash memory, the cost is a key factor.

In a flash EEPROM, the floating gate on the floating gate transistor is used to selectively store charges. FIG. 1 shows a simple stacked structure of a non-volatile memory device. An isolation region 11 is formed on a substrate 10, to define an active region. A spacer is formed on the substrate 10 for the isolation between adjacent devices. A gate oxide layer 12 of a floating gate transistor is formed on the substrate 10. A gate electrode structure is fonned on the gate oxide layer 12. The gate electrode structure comprises a poly-silicon floating gate 13, an inter-dielectric layer 14, and a doped poly-silicon controlling gate 15. A spacer is formed on the side wall of the gate electrode structure. On the substrate 10, a channel region is defined between the source/drain region 17. The source/drain region 17 is located between the gate electrode structure and the isolation region 11.

FIG. 2 shows the structure of a conventional array of a flash memory. On a semiconductor substrate (not shown), a gate oxide layer (not shown) is formed. Parallel poly-silicon lines isolated by an oxide layer 20 are formed on the gate oxide layer. A dielectric layer (not shown) is formed on the poly-silicon lines. Word lines 21 are then formed and defined perpendicular to the poly-silicon lines with a predetermined distance with each other. While defining the word lines 21, the poly-silicon lines are defined to form tloating gates 22 simultaneously. Meanwhile, drain regions 23 and source regions 24 are also defined.

The layout of a conventional array of a flash memory array is also shown on FIG. 2. Due to the shift of plhotomasks, a misalignment is very likely to happen, and hence the dimension of each source line is different from each other. The source erase characteristics of each source line are, therefore, different from each other. Thus, in the conventional flash memory array, an alignment margin α is formed between the word lines 21 and the source regions 24.

SUMMARY OF THE INVENTION

It is therefore an object of the invention to provide a method of eliminating the alignment margin between word lines and source lines. The source erase characteristic is therefore identical. In addition, after eliminating the alignment margin, the dimension of the device is reduce, and a higher integration is obtained.

To achieve these objects and advantages, and in accordance with the purpose of the invention as embodied and broadly described herein, the invention is directed towards a method of fabricating a flash memory. A semiconductor substrate having a field oxide layer which comprises a plurality of parallel oxide lines, a plurality of parallel word lines perpendicular to the parallel oxide lines, a dielectric layer having a same structure as and under the word lines, a plurality of floating gates separated by the field oxide layer from each other under the dielectric layer, and a plurality of regions encompassed by the field oxide layer and the word lines is provided. A first step of ion implantation to the substrate is performed by using the word lines as masks, so that a plurality of source regions and a plurality of drain regions are formed beside the word lines. Whereas each of the source regions and each of the drain regions are formed in the regions encompassed by the field oxide layer and the word lines. A photo-resist layer is firmed to cover the drain regions. A second step of ion implantation to the substrate is performed by using the photo-resist layer and the parallel word lines as masks. The photo-resist layer is removed.

It is to be understood that both the foregoing general description and the following detailed description are exemplary and explanatory only and are not restrictive of the invention, as claimed.

DESCRIPTION OF THE PREFERRED EMBODIMENTS

Figure 1:
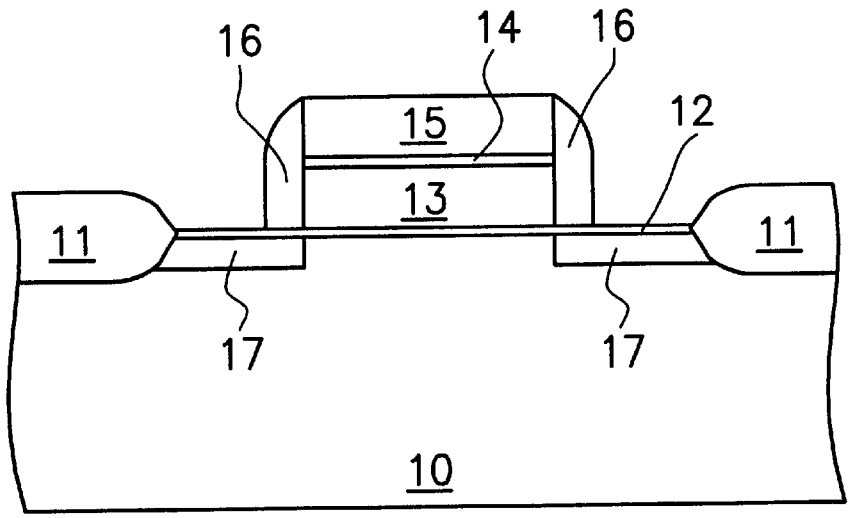
FIG. 1 is a cross sectional view of a conventional flash memory.
Figure 2:
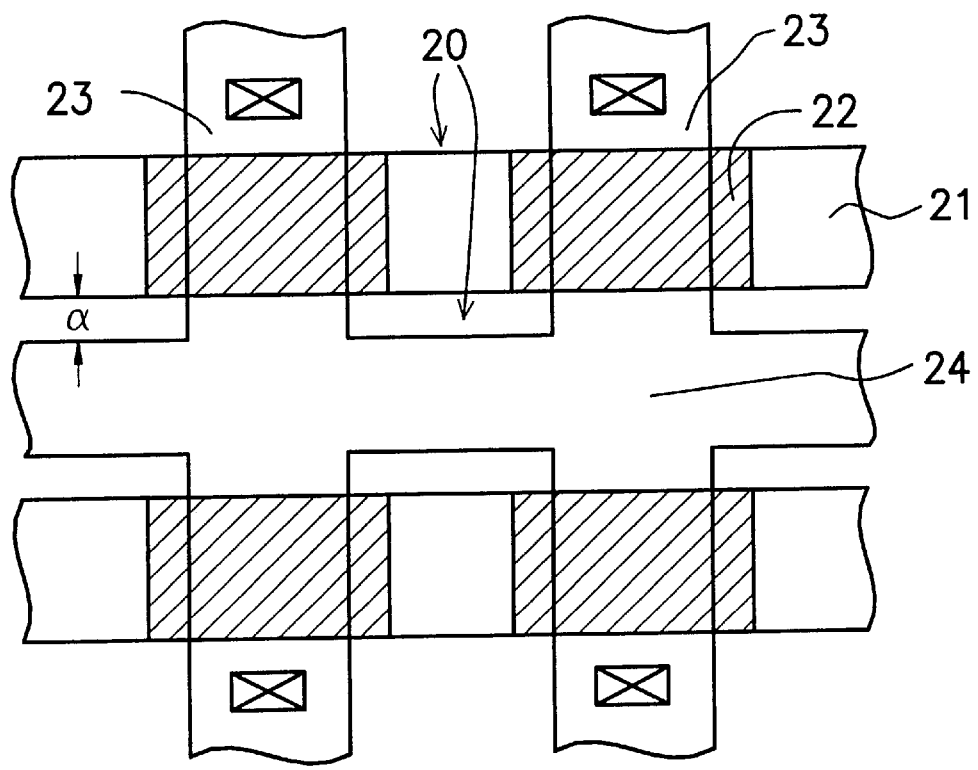
FIG. 2 is a schematic drawing of a conventional flash memory array.
Figure 3:
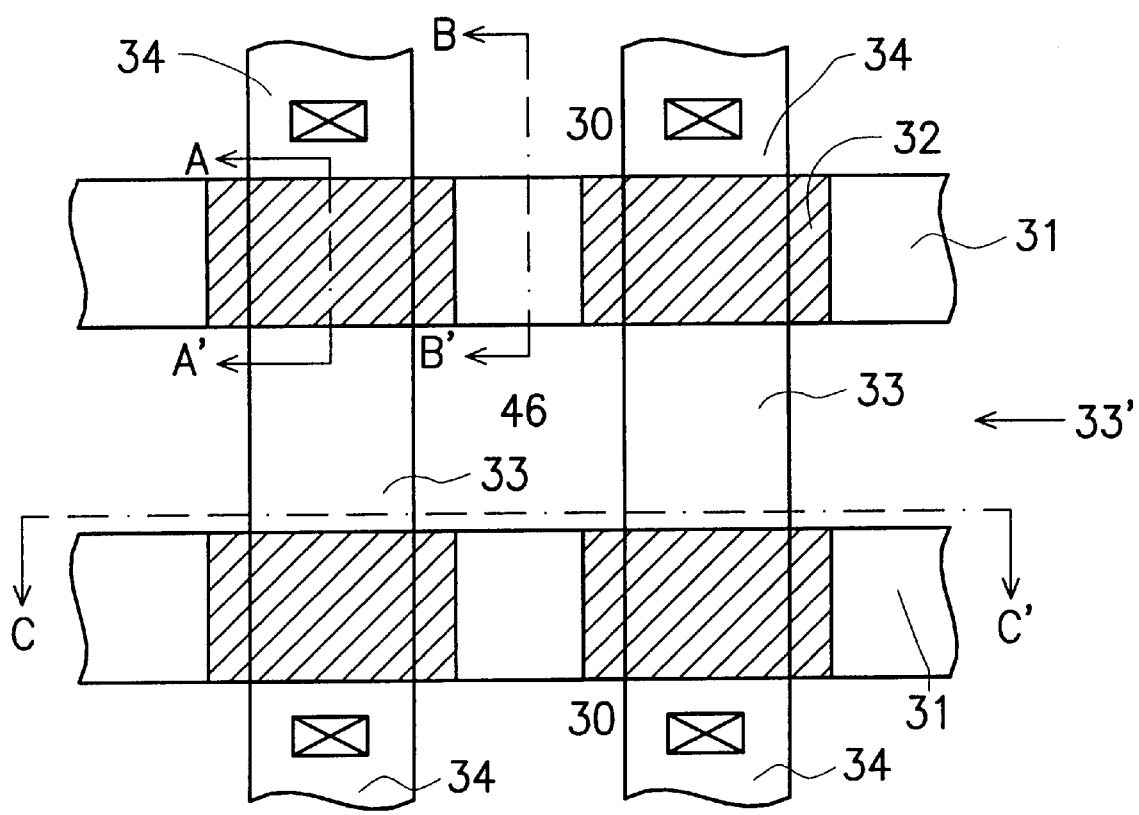
FIG. 3 is a schematic drawing of a flash memory array in a preferred embodiment according to the invention.
Figure 4A:
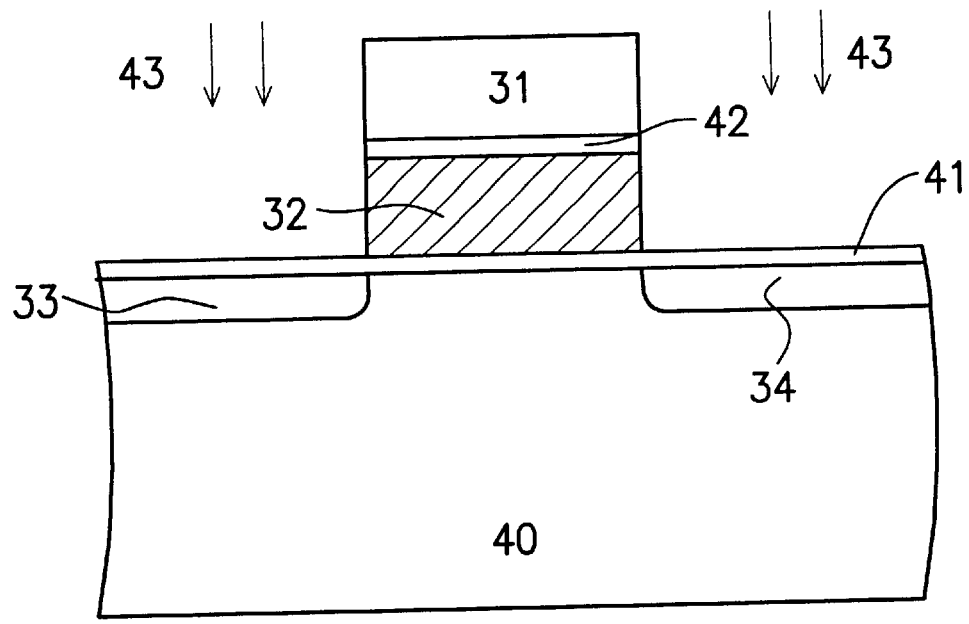
FIG. 4A to FIG. 4B show the cross sectional views of the process of fabricating a flash memory array along the line A-A' shown in FIG. 3.
Figure 5A:
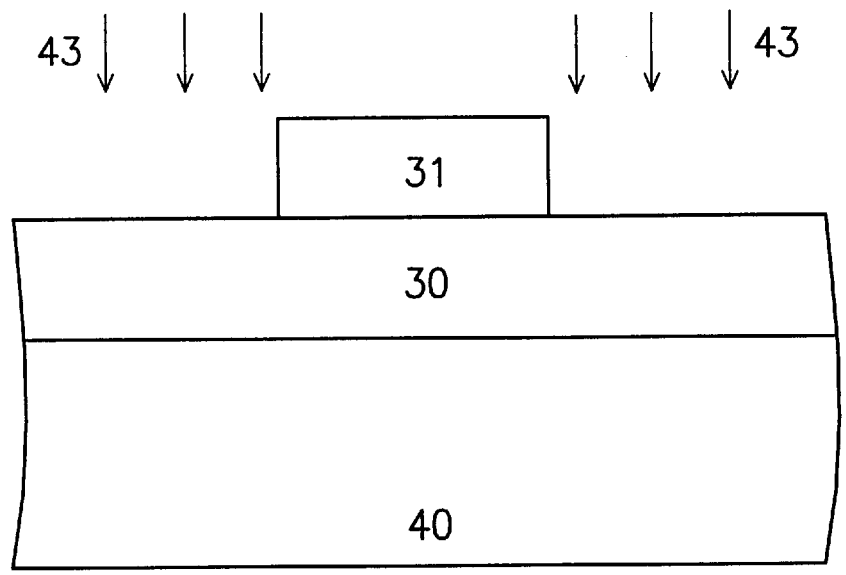
FIG. 5A to FIG. 5B show the cross sectional views of the process of fabricating a flash memory array along the line B-B' shown in FIG. 3.
Figure 6:
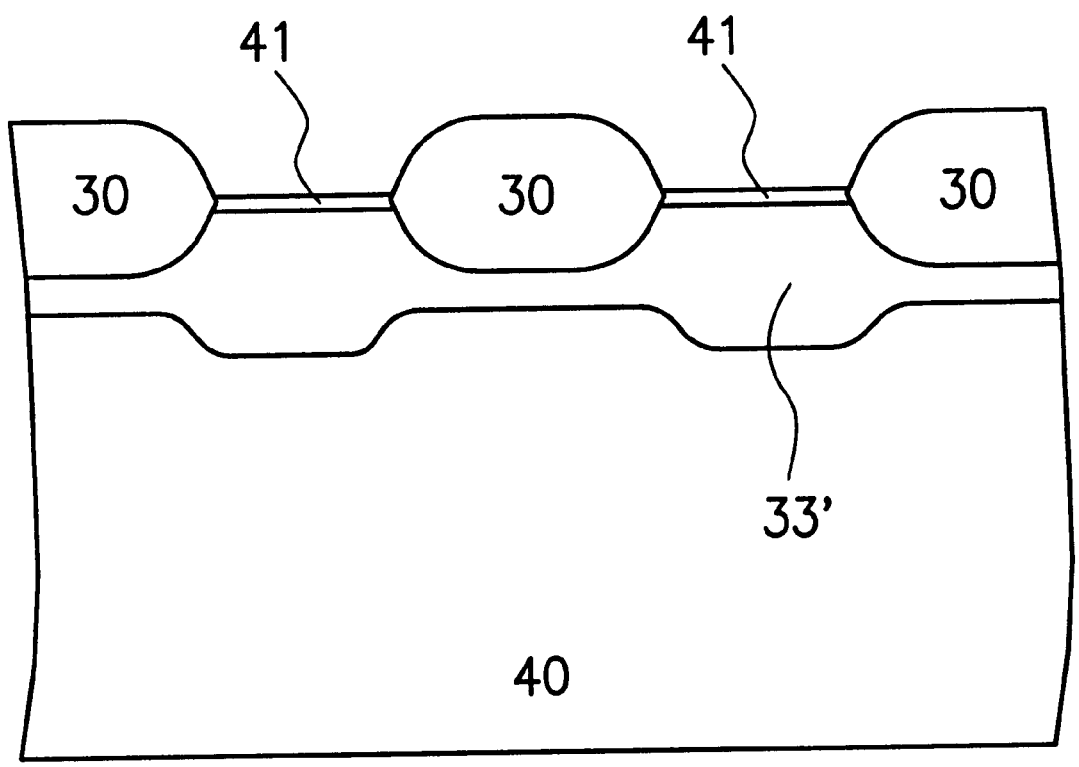
FIG. 6 shows the cross sectional view of the process of fabricating a flash memory array along the line C-C' shown in FIG. 3

Referring to FIG. 3, FIG. 4A, FIG. 5A, and FIG. 6, on a substrate 40, to defined an active region, a field oxide layer is formed and patterned into parallel field oxide lines 30. Therefore, the active region is in a form of parallel lines equidistantly separated by the parallel field oxide lines 30. A gate oxide layer 41 is formed on the active region. A first conductive layer, such as a doped poly-silicon layer, is formed and patterned to cover the gate oxide layer 41. Thus, the resultant first conductive layer is in a form of first parallel conductive lines 31 equidistantly separated by the parallel field oxide lines 30. A dielectric layer, such as an oxide/nitride/oxide (ONO) layer is formed over the substrate. On the dielectric layer, a second conductive layer, such as a doped poly-silicon layer, is formed. Using photo-lithography and etching process, the second conductive layer, the dielectric layer, and the first conductive layer are defined and selectively removed. Word lines 31, that is, the controlling gates, are formed of the defined second conductive layer in a form of equidistant second parallel conductive lines perpendicular to the field oxide lines 30. Simultaneously, the first conductive lines are defined into island shaped floating gates 32. Moreover, the resultant dielectric layer 42 is also formed as the same structure as the controlling gates as shown on FIG. 4A.

Figure 4B:
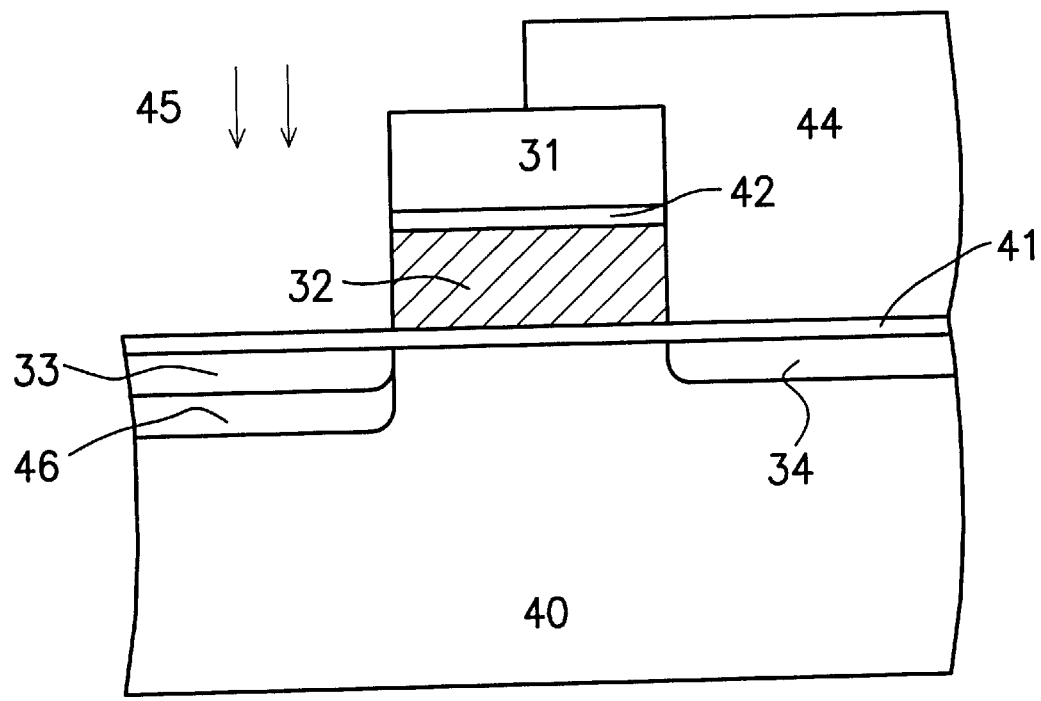
Figure 5B:
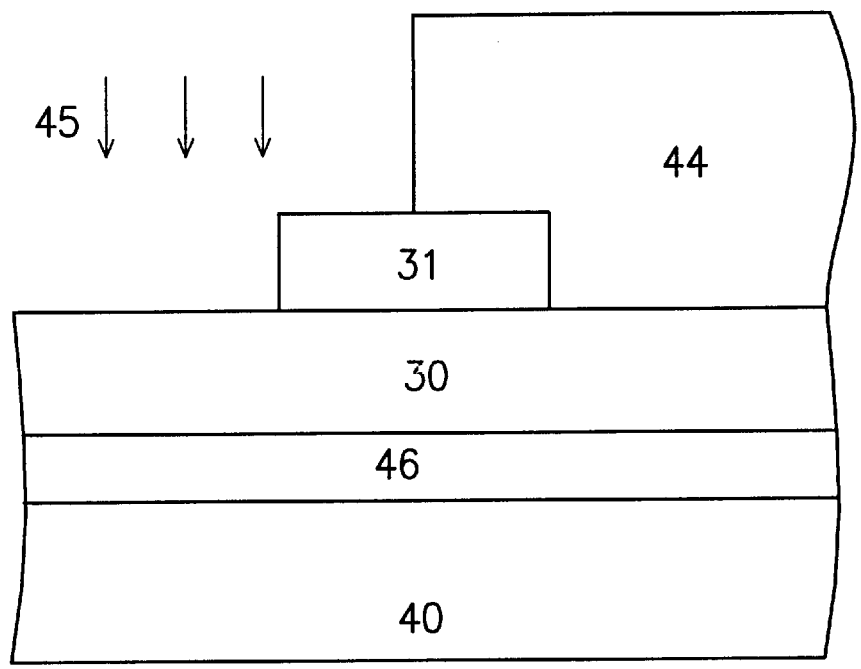

Referring to FIG. 3F, FIG. 4B, FIG. 5B, and FIG. 6, using the word lines as masks, a first step of ion implantation is performed to the substrate beside the word lines. A source region 33 and a drain region 34 are formed in regions encompassed by the oxide layer 30 and the word lines 31, and separated from each other by the oxide layer 30. The implanted ion 43 of the first step of ion implantation is, for example, arsenic ion with a dosage of about 3E15 cm$^{-2}$ at an energy about 50 KeV. A photo-resist layer 44 is formed to cover at least the drain region 34. Using the photo-resist layer and the word lines 31 as masks, a second step of ion implantation is performed. The implanted ion 45 of the second step of ion implantation is, for example, phosphorous ion with a dosage of about 1E14 cm$^{-2}$ to 1E15 cm$^{-2}$ at an energy about 120 KeV to 500 KeV. The larger energy of the second step of ion implantation enables the phosphorous ion to be implanted through the field oxide layer 30 in the regions between two word lines and the source region 33, and therefore, a doped region 46 is formed under the field oxide layer 46. The doped region 30' is functioned as a sharing source. The source region 33 and the sharing source 46 are therefore electrically connected and assembled as a source line 33'. The photo-resist layer is 44 then removed by a conventional method.

In the conventional process with a line width of 0.5 μm, an alignment margin of about 0.2 μm to 0.4 μm is required. In the flash memory fabricated by the above process according to the invention, the alignment margin between word lines and source regions are eliminated. For the process with a line width of 0.5 μm, the elimination of the alignment margin reduces the space occupied by the memory cell in a flash memory up to 20%. Furthermore, up to 50% of the space is saved for the process with a line width of 0.25 μm. Therefore, the integration is increased. In addition, the dimension of the source region is identical, and therefore, the erase characteristics of source regions in the flash memory become unified. The reliability is enhanced due to the unified erase characteristics.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a flash memory, comprising:

providing a semiconductor substrate having a field oxide layer which comprises a plurality of parallel oxide lines, a plurality of parallel word lines perpendicular to the parallel oxide lines, a dielectric layer having a same structure as and under the word lines, a plurality cof floating gates separated by the field oxide layer from each other under the dielectric layer, and a plurality of regions encompassed by the field oxide layer and the word lines;

performing a first step of ion implantation to the substrate, using the word lines as masks, so that a plurality of source regions and a plurality of drain regions are formed beside the word lines in the regions encompassed by the field oxide layer and the word lines, and separated by the field oxide layer from each other;

forming a photo-resist layer to cover the drain regions;

performing a second step of ion implantation to the substrate to form a source line under the source regions with electrical contact and under a portion of the parallel oxide lines, using the photo-resist layer and the parallel word lines as masks; and removing the photo-resist layer.

2. The method according to claim 1, wherein the ion used in the first step of ion implantation is arsenic ion.

3. The method according to claim 2, wherein the arsenic ion has a concentration of about 3E15 cm$^{-2}$ at an energy of about 50 KeV.

4. The method according to claim 1, wherein the ion used in the second step of ion implantation is phosphorous ion.

5. The method according to claim 4, wherein the phosphorus ion has a concentration of about 1E14 cm$^{-2}$ to 1E15 cm$^{-2}$ at an energy of about 120 KeV to 500 KeV.

6. A method of fabricating a flash memory, comprising:

providing a substrate having a field oxide layer which comprises a plurality of parallel oxide lines, a plurality of parallel active regions defined and equidistantly separated by the field oxide layer, and a gate oxide layer;

forming a first conductive layer over the substrate;

patterning the first conductive layer into a plurality of first conductive lines on the active regions parallel to and equidistantly separated by the field oxide layer;

forming a dielectric layer over the substrate;

forming a second conductive layer over the dielectric layer;

patterning and selectively removing the second conductive layer, the dielectric layer, and the first conductive lines, so that a plurality of word lines formed of the second conductive layer are formed perpendicular to the parallel oxide lines, whereas under each of the word lines, comprising a plurality of island shaped floating gates formed of the first conductive layer, the dielectric layer, and a controlling gate line formed of the second conductive layer; and a plurality of regions being defined and encompassed by the word lines and the field oxide layer;

performing a first step of ion implantation to the substrate, using the word lines as masks, so that a plurality of source regions and a plurality of drain regions are formed beside the word lines in the regions encompassed by the field oxide layer, and each of the source regions and each of the drain regions are separated by the field oxide layer;

forming a photo-resist layer to cover the drain regions;

performing a second step of ion implantation to the substrate to form a source line under the source regions with electrical contact and under a portion of the parallel oxide lines, using the photo-resist layer and the parallel word lines as masks; and removing the photo-resist layer.

7. The method according to claim 6, wherein the first conductive layer is a doped poly-silicon layer.

8. The method according to claim 6, wherein the second conductive layer is a doped poly-silicon layer.

9. The method according to claim 6, wherein the ion used in the first step of ion implantation is arsenic ion.

10. The method according to claim 9, wherein the arsenic ion has a concentration of about 3E15 cm$^{-2}$ at an energy of about 50 KeV.

11. The method according to claim 6, wherein the ion used in the second step of ion implantation is phosphorous ion.

12. The method according to claim 11, wherein the phosphorus ion has a concentration of about 1E14 cm$^{-2}$ to 1E15 cm$^{-2}$ at an energy of about 120 KeV to 500 KeV.

* * * * *